Nov. 7, 1950 W. C. JACKSON 2,528,519

TUNING DEVICE

Filed March 23, 1946 4 Sheets-Sheet 1

INVENTOR.
Wilbur C. Jackson,
BY
Mueller and Mason
Atty's.

Nov. 7, 1950 W. C. JACKSON 2,528,519

TUNING DEVICE

Filed March 23, 1946 4 Sheets-Sheet 2

INVENTOR.
Wilbur C. Jackson,
BY
Mueller and Mason
Atty's.

Nov. 7, 1950 W. C. JACKSON 2,528,519

TUNING DEVICE

Filed March 23, 1946 4 Sheets-Sheet 3

INVENTOR.
Wilbur C. Jackson,
BY
Mueller and Mason
Attys.

Nov. 7, 1950 W. C. JACKSON 2,528,519

TUNING DEVICE

Filed March 23, 1946 4 Sheets-Sheet 4

INVENTOR.

Wilbur C. Jackson,

BY

Mueller and Mason

Attys.

Patented Nov. 7, 1950 2,528,519

UNITED STATES PATENT OFFICE 2,528,519

TUNING DEVICE

Wilbur C. Jackson, Oak Park, Ill., assignor to Motorola, Inc., a corporation of Illinois Application March 23, 1946, Serial No. 656,575

19 Claims. (Cl. 192—143)

This invention relates generally to control apparatus and in particular to a remotely operated tuning device for radio receivers.

Tuning devices for radio receivers having push buttons for selecting pre-set frequencies have been found to be very convenient and are particularly desirable for use in applications where the person listening to the radio is otherwise engaged and has very little time for tuning the radio receiver, as in automobile radios. It is desirable that such tuning mechanism be as simple as possible and be arranged so that the pre-set frequencies can be readily changed to any frequencies which the receiver is capable of receiving. Further, it is desirable that provision be made for operating the tuner by controls which are remote from the receiver itself. This latter provision is also particularly important in automobile receivers in which the receiver is normally positioned on the firewall of the automobile out of reach of the operator and passengers, and a control head for tuning the receiver is positioned on the dash of the automobile.

Tuning devices of this type in the prior art have been of two general types. In one type a plurality of separate tuning circuits are provided for the radio, each of which may be tuned to a different frequency, and a switching mechanism is provided for connecting any one of the tuning circuits in the radio receiver circuit. Such a mechanism is very expensive in that a plurality of duplicate components are required.

The second type of tuning devices in use are devices having mechanical means for tuning a single set of controls to various positions. These devices are adapted to change the position of variable condensers in the tuning circuits of radio receivers or to vary the inductance of the circuit by changing the position of the cores in the coils of variable inductances. This latter arrangement is generally referred to as permeability tuning. Prior art devices of this type have been large and cumbersome and, consequently, expensive to produce. Such devices have also generally required large solenoids or other driving means which cause heavy current drain. These devices have been unsatisfactory, particularly in automobile installations where it is necessary that both the size and the current drain of the device be kept as small as possible, as a limited amount of space is available, and the power available from the vehicle battery is almost entirely utilized by other accessories.

It is further desirable that tuners for radio receivers be very accurate so that the receiver will be tuned precisely to the frequency desired each time the tuning mechanism is operated. Also, an arrangement to permit rapid setting up of the pre-set frequencies is desirable which also must be very accurate and simple in operation.

It is, therefore, an object of this invention to provide an improved electrically operated tuning device for radio receiver apparatus which is of simple, compact and inexpensive construction.

It is a further object of this invention to provide a tuning device having a minimum of moving parts and in which the mass of the moving parts is small so that the device will operate quietly and a small amount of electrical power will be required for operation thereof.

An additional object of this invention is to provide a tuning mechanism including means for pre-setting a plurality of frequencies in which the tuning mechanism will accurately tune the receiver to the frequency desired each time a particular frequency is selected, and a simple arrangement for pre-setting the tuning mechanism to the frequencies desired.

A feature of this invention is the provision of a tuning device for a radio receiver having an operating member connected to the frequency selecting components of the receiver which is moved into abutment with adjustable fixed stops by a single compact carriage and shaft assembly to thereby tune the receiver to various frequencies.

A further feature of this invention is the provision of a tuning device for a radio receiver including an operating member movable into abutment with fixed stops by a single carriage and shaft assembly which imparts reciprocal and rotary motion to said operating member for moving the same from one stop to the next stop, and a circuit including a solenoid for driving the carriage assembly and moving the operating member step by step to the various stops until the desired stop is reached.

A still further feature of this invention is the provision of a radio tuning device having a plurality of stops for defining positions of the frequency changing means corresponding to particular radio frequencies and means for adjusting the positions of the stops which is self-contained in the tuning device and which is simple in operation and provides accurate adjustment of the stops.

Further objects, features and advantages of this invention will become apparent from the following description when taken in connection with the accompanying drawings in which.

In practicing my invention I provide a radio receiver having a permeability tuned circuit in which the frequency of the radio receiver is controlled by the position of magnetic cores in the tuning coils of the receiver circuit. The cores are anchored to an operating member, the position of which determines the frequency which will be received. Means for controlling the position of the operating member are provided which include a frame having stops thereon against which the operating member abuts, and an actuating mechanism including a solenoid for moving said operating member consecutively to the positions defined by the various stops. The actuating mechanism includes a carriage unit supported on the frame structure for longitudinal movement along a twisted shaft, the carriage unit having a tubular portion which fits in the solenoid and contains a ratchet assembly cooperating with the shaft to cause rotary movement of the operating member with each reciprocal movement of said carriage. A circuit is provided for the solenoid permitting remote operation thereof and causing said solenoid to move the operating member step by step until the station selected has been reached. Means for adjusting the stops to thereby change the frequencies to which the tuning device is set is included in the device and provides for accurate setting of the stops so that the receiver will be tuned precisely to the frequencies desired.

Figures 1, 8, 9:
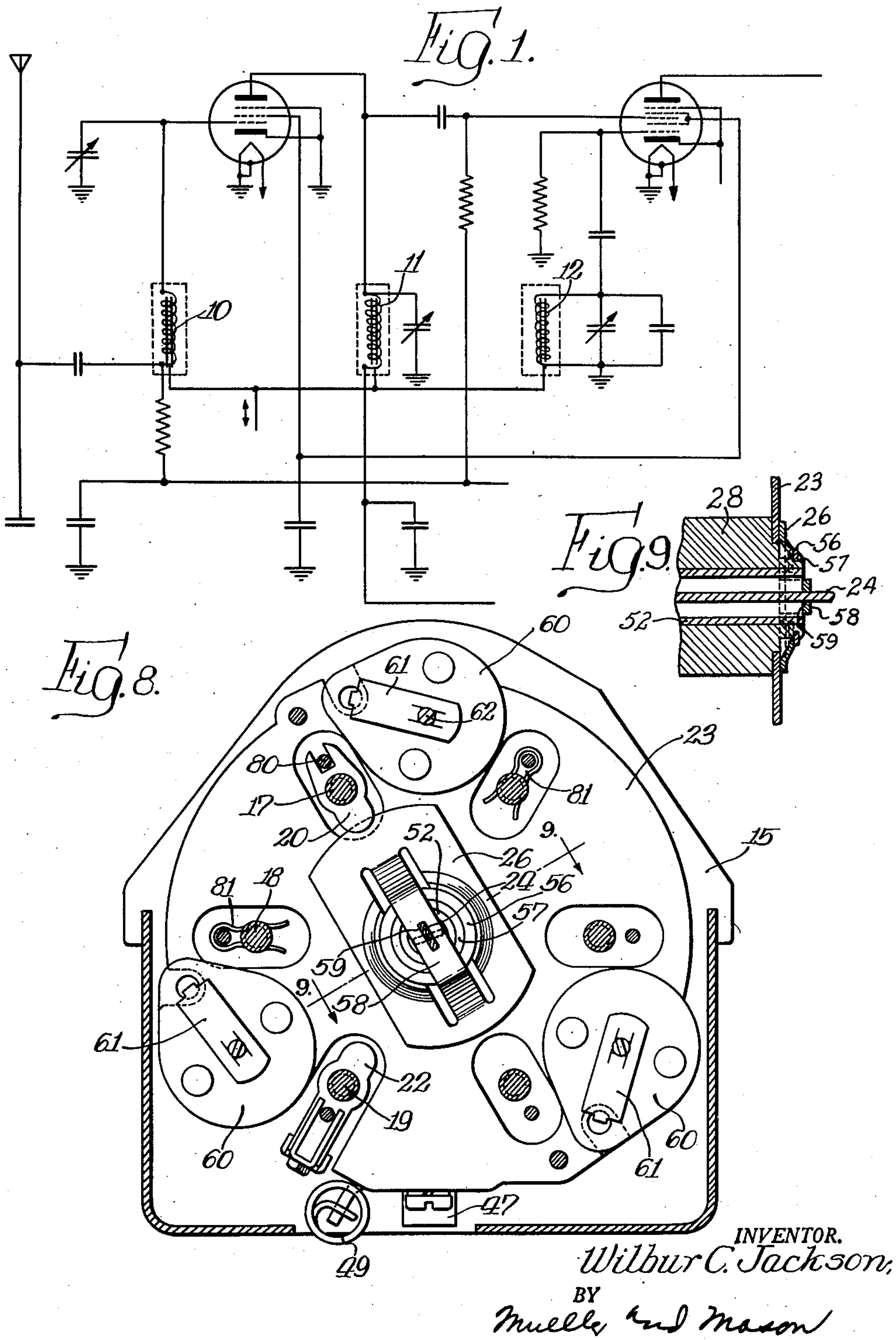
Fig. 1 is the circuit of a radio receiver showing the frequency changing means.
Fig. 8 is a cross-sectional view of the tuning device along the lines 8—2 of Fig. 6.
Fig. 9 is a cross-sectional view along the lines 9—9 of Fig. 8.
Figure 2:
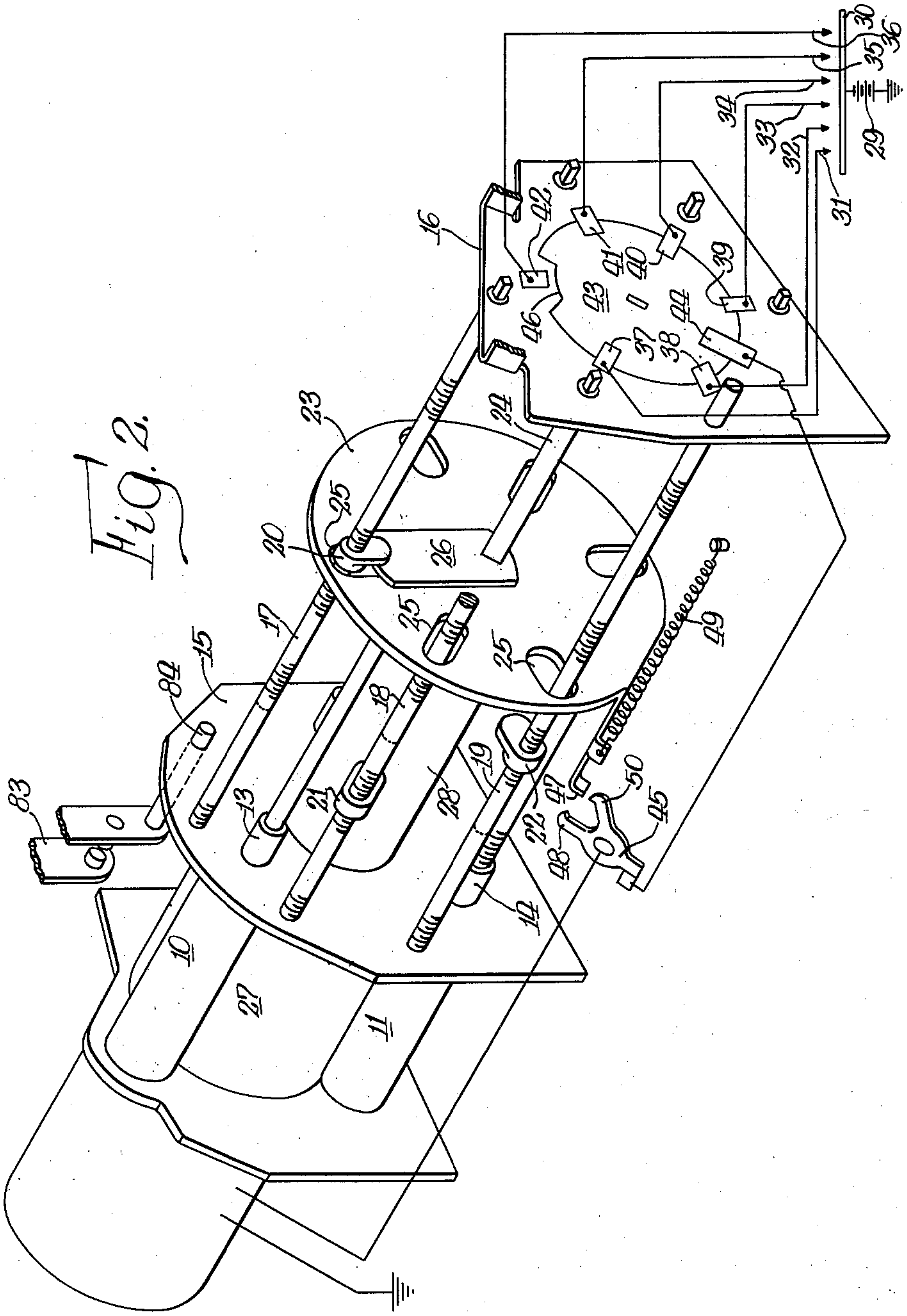
Fig. 2 illustrates diagrammatically the operation of the tuning device of this invention.
Figure 3:
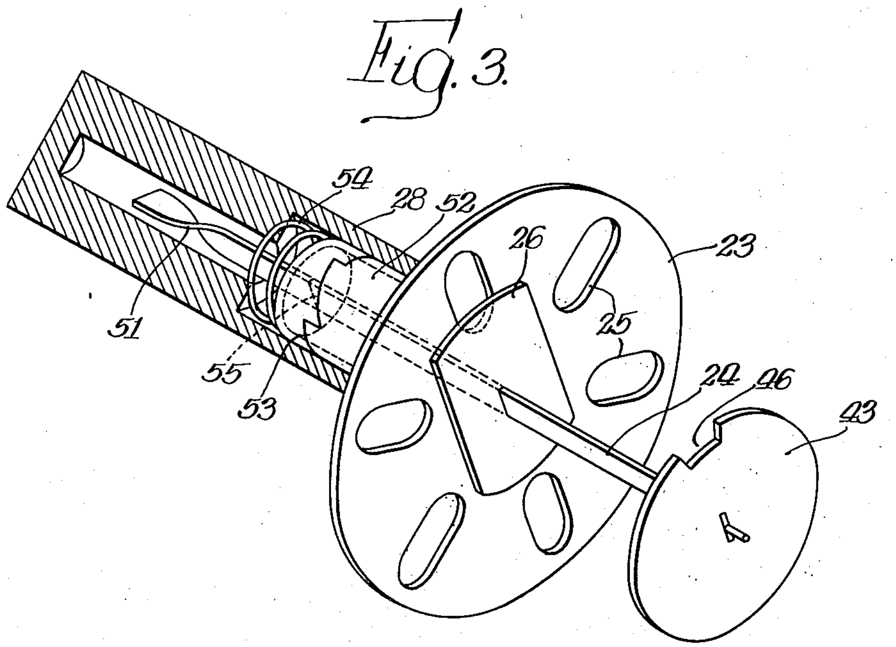
Fig. 3 illustrates the operation of the mechanically moving parts of the apparatus.
Figure 4:
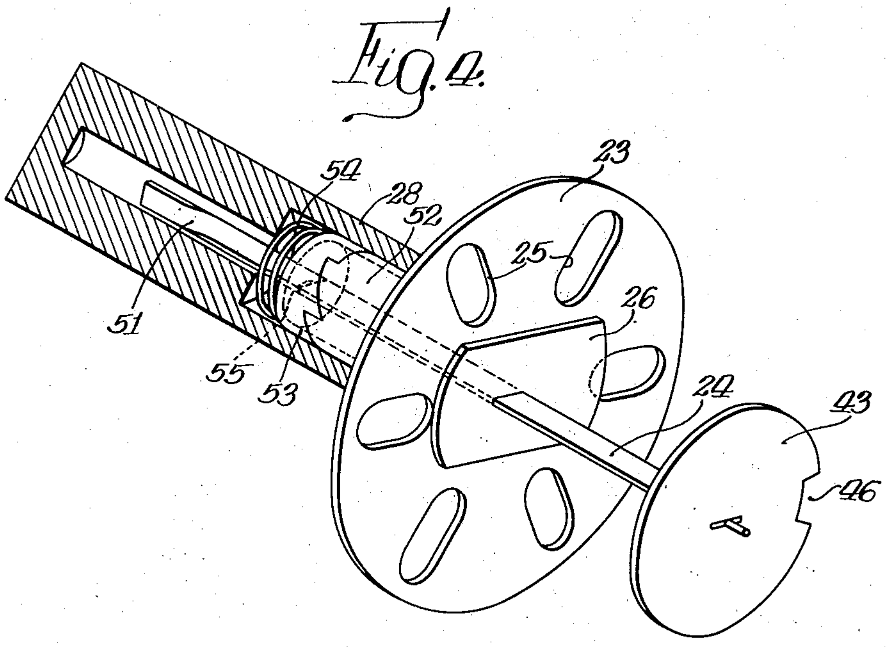
Fig. 4 shows the mechanical parts of Fig. 3 in a different position.

Referring now to the drawings, in Fig. 1 is shown a portion of the circuit of a standard amplitude modulated radio receiver having coils 10, 11 and 12 with movable cores therein for tuning the antenna circuit, and the radio frequency and oscillator stages of the receiver. It is to be understood that the invention may also be applied to various other types of circuits. These coils are wound in such a manner that the circuit will track properly when the various cores are positioned in the coils corresponding amounts. The cores are shown anchored together for operation by a common operating member. In Figs. 2, 3 and 4 is illustrated the mechanism for moving the cores. The coils 10 and 11 are shown secured to a frame structure and having cores 13 and 14 movably positioned therein. The coils 10, 11 and 12 are mounted on the frame in equally spaced angular positions. To simplify the drawings, all the coils are not shown in each of the figures.

The structure for moving the cores consists of supporting frame means including end members 15 and 16 and a plurality of threaded rods 17, 18 and 19 supported for rotation and limited longitudinal movement therebetween. The ends of the rods project through the end plates for reasons to be fully explained later. Any number of rods may be provided but in the structure illustrated, six such rods are provided. For the purpose of explaining the operation of the structure, reference will be made only to the rods indicated as 17, 18 and 19, as it is believed that this will simplify the description and furnish adequate disclosure for a complete understanding of the invention. The rods carry stops 20, 21 and 22 thereon which include threaded openings engaging the threads on the rods for adjustably positioning the stops on the rods. A carriage unit 23 is movably supported on the frame structure for movement along a shaft 24 which has one end supported on the frame structure and the other end projecting into said carriage unit. The movable carriage 23 has openings 25 therein permitting the member to move along the rods without engaging the stops. An operating member 26 is secured to the carriage 23 for longitudinal movement with the carriage along the shaft 24. The member 26 is further capable of rotary movement with respect to the carriage with the shaft 24.

A solenoid 27 is secured to the frame structure and has an opening therein to receive a tubular portion 28 of the carriage unit 23. The portion 28 is made of magnetic material so that it will be influenced by the field of the solenoid. For the purpose of selectively energizing the solenoid, a circuit is provided including a battery 29, a switch assembly 30 having a plurality of switches 31, 32, 33, 34, 35 and 36. The switches are connected in series with a plurality of contacts 37, 38, 39, 40, 41 and 42 which are adapted to selectively contact a movable circular contact 43. For making a continuous connection with the contact 43, a contact 44 is provided which is connected through switch 45 to the solenoid 27. The circular contact 43 has a notch 46 in the periphery thereof so that one of the contacts will at all times be disengaged for a reason to be later described. It can thus be seen that when contact is made by one of the switches 30, a circuit is established through the solenoid causing the tubular portion 28 to be drawn into the solenoid and the carriage 23 moved to the left (Fig. 2). The carriage 23 carries an arm 47 which is positioned to actuate the fork 48 of switch 45, breaking the circuit to the solenoid when the carriage unit approaches the end member 15. A spring 49 is attached to the arm 47 to move the carriage to the right after the solenoid circuit has been opened. As the carriage 23 moves to the right the arm 47 will engage the fork 50 of the switch 45 causing the circuit to the solenoid to be again closed. The operating member 26 is positioned on the carriage 23 so that it will project into one of the openings 25 therein and will engage one of the stops preventing further movement of the carriage to the right. It is seen from the above that the axes of the rods on which the stops are supported remain fixed at all times and the operating member moves step by step from one stop to the next.

The mechanism for causing rotary movement of the member 26 with respect to the carriage is shown in Figs. 3 and 4. The shaft 24 is of rectangular cross section with cylindrical bearing surfaces on one end for support on the frame structure. The shaft has a twisted portion 51 at the end thereof adjacent to the solenoid for a reason to be presently explained. The tubular portion 28 encloses a ratchet assembly comprised of a fixed member 52, a movable member 53 and a spring 54 which tends to hold the movable member 53 in position against the fixed member 52. The member 52 is fixed to the tubular member 28 whereas the member 53 is capable of longitudinal and rotary movement within this member. The movable member 53 has a rectangular opening 55 therein which fits the rectangular shaped shaft 24. As the carriage unit 23 and the tubular portion 28 thereof move to the left under the influence of the solenoid, the opening 55 slides along the shaft 24 and when the twisted portion of the shaft 51 is engaged, the shaft will tend to cause the movable member 53 to rotate in a counter-clockwise direction. However, the teeth of the ratchet prevent rotation of the movable member in a counter-clockwise direction and, accordingly, the shaft will be rotated in a clockwise direction. As the circuit to the solenoid is disconnected and the carriage 23 moved to the right under the pull of the spring, the movable member 53 will again traverse the twisted portion of the shaft 24, but in this case the movable member will tend to rotate in a clockwise direction. As the teeth of the ratchet are arranged to permit movement in this direction, the movable member 53 will be rotated in a clockwise direction. It is necessary that a balance between the friction of the movable member 53 and the friction of the shaft 24 be obtained so that the member 53 will be rotated instead of the shaft as the carriage 23 moves to the right. The operating member 26 and circular contact 43 are provided with rectangular openings engaging the rectangular shaft so that these members are rotated along with the shaft and are moved in a clockwise direction one step with each reciprocal movement of the carriage 23. The extent of rotary movement of the shaft required depends on the number of rods and stops provided. The required amount of rotation can be provided by proper design of the twist in the shaft 51 and the teeth of the ratchet assembly. In a structure having six rods as disclosed, the axis must rotate 60 degrees with each reciprocal movement so that with each reciprocal movement of the carriage the operating member 26 is moved from one stop to the next stop and the slot 43 in the circular contact is moved from one contact to the next contact. Fig. 4 discloses the same structure as Fig. 3 but shows the shaft, operating member and contact moved two positions from that shown in Fig. 3.

Referring now to Fig. 2, it can be seen that the operation of the tuning mechanism is as follows. Upon actuation of one of the switches in switch assembly 30, switch 31 for example, a circuit is completed through the contact 37, the movable contact 43, contact 44 and switch 45 causing the solenoid to be energized and the carriage 23 moved to the left. As the carriage reaches the end of the stroke the operating member 26 and the movable contact 43 will be rotated in a clockwise direction one step as described above. As the carriage approaches the end plate 15 the arm 47 actuates switch 45 and the circuit to the solenoid is broken. The spring 49 will then pull the carriage to the right causing the arm 47 to strike the fork 50 of the switch 45 closing the circuit again and the solenoid will again pull the carriage to the left. This operation will continue until the notch 46 of the contact 43 is positioned adjacent to the contact 37 breaking the solenoid circuit. The carriage then moves to the right until the operating member 26 comes into abutment with the stop associated with contact 37. It can be seen that the switches 30, the contacts and the rods are associated so that actuation of a particular switch will result in movement of the operating member into abutment with a particular stop. In the operation described above the switch 31, contact 37, rod 18 and stop 21 are associated so that the operating member 26 will move in abutment with the stop 21 on the rod 18 when the switch 31 has been closed and the contact 37 has been energized. It is pointed out that in operation of the device the stops remain fixed and the operating member is moved into abutment with the stops by the carriage and shaft assembly.

Figures 5, 6, 7:
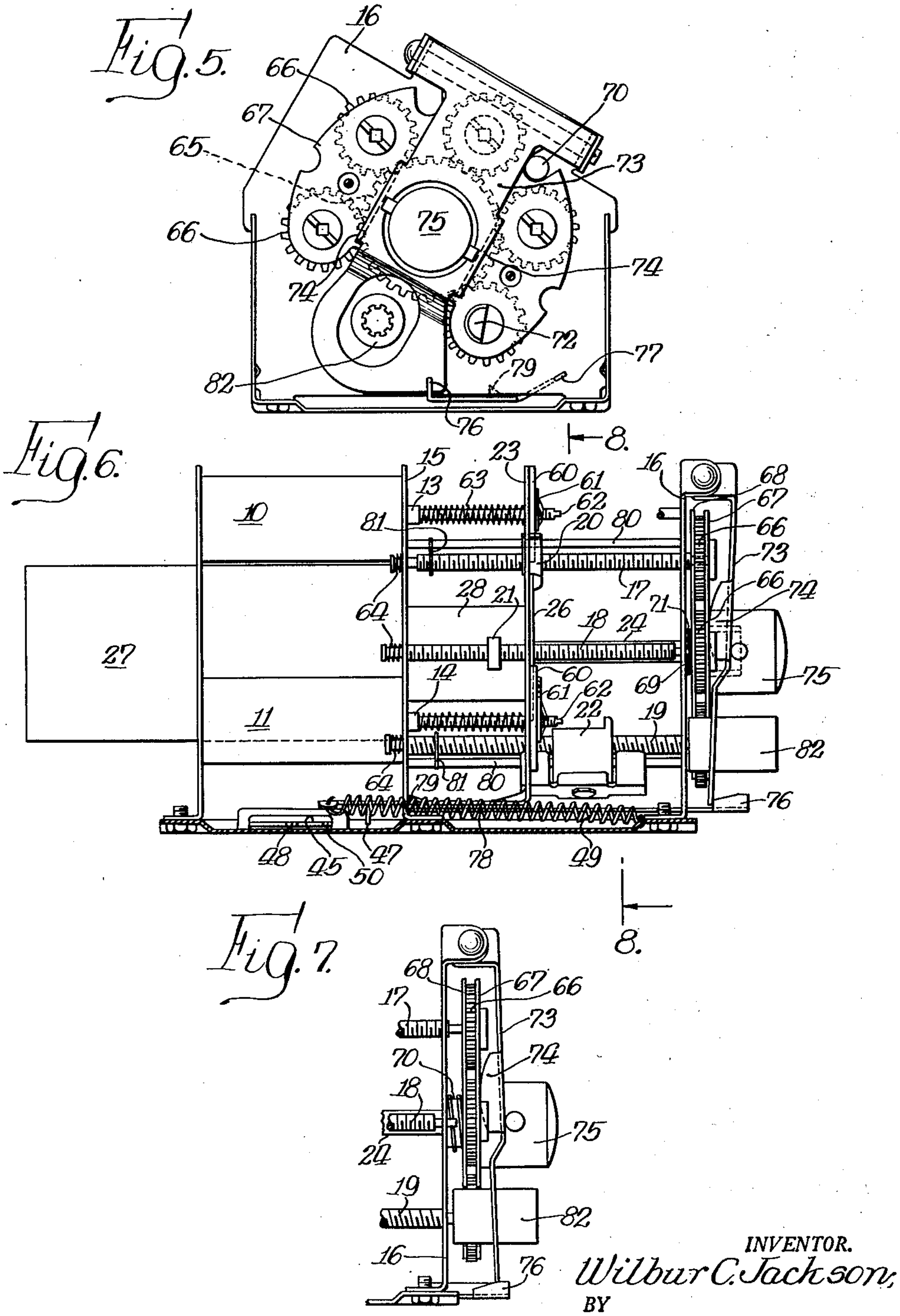
Fig. 5 is an end view showing the manual tuning and pre-setting arrangement.
Fig. 6 is a side view of the tuning device showing the pre-setting arrangement in position to change the frequency of one of the pre-set channels.
Fig. 7 is a side view showing the tuning device in operative condition with the pre-setting arrangement disengaged.

In Figs. 6, 8 and 9 is illustrated the detailed construction of one form in which the invention may be embodied. In these figures carriage unit 23 is shown as including a generally circular plate having the tubular portion 28 secured centrally thereto. The operating member 26 is secured to the carriage 23 by the circular ring 56 through which a portion 57 of the tubular member 28 extends. As is apparent in Figs. 8 and 9 the ring 56 is positioned between the main portion of the operating member 26 and a punched out portion 58. The punched out portion 58 has a rectangular opening 59 therein which fits over the shaft 24 to cause the operating member to follow the rotary movement of the shaft. It is, therefore, seen that the operating member 26 is free to rotate about the tubular member 28 being slidably positioned between the carriage 23 and the frame 56. The punched out portion 58 of the operating member causes the member to rotate with respect to the carriage in response to rotary movement of the shaft 24. For the purpose of insulating the cores 13 and 14 from the carriage 23, insulating members 60 are secured to the carriage. Clips 61 are secured to the insulating members having threaded openings which engage the threaded extensions 62 of the cores. Openings are provided in the carriage unit through which the extensions extend providing clearance between the carriage and the extensions. The ends of the threaded extensions are flattened so that the extensions can be adjusted with respect to the clips and, therefore, with respect to the carriage unit 23. Springs 63 are positioned about the extensions 62 between the cores and the insulating members 60 to prevent play between the various connecting members.

Figs. 5, 6, 7 and 8 illustrate the detailed structure of the rod and stop assemblies and the mechanism for changing the position of the stops on the rods. As is clearly shown in Fig. 6, the rods 17, 18 and 19 are supported on the end plates 15 and 16 for limited longitudinal movement thereon. Springs 64 are provided which tend to hold the rods in a position with the shoulders of the rods 17, 18 and 19 in abutment with the plate 15. However, as the operating member 26 contacts a particular stop, such as 20 for example, the pull to the right on the carriage 23 caused by the spring 49 causes the stop and rod to be moved to the right. Accordingly, the position of the operating member 26 is determined by the stop when in this shifted position. For this reason the rods must be in the shifted position when the position of the stops thereon are pre-set. The mechanism for pre-setting the position of the rods utilizes the shifted position of the rods for making engagement therewith. The rods are provided with square portions on the ends which project through the plate 16 when the rods are in actuated position. For rotating the rods, a gear assembly is provided on the plate 16 including a central gear 65 and a plurality of gears 66 which are associated with each of the rods except rod 19. These gears are mounted between plates 67 and 68 which are supported on shaft 69 secured to the plate 16. The gear assembly is free to slide on this shaft but is prevented from rotation by a stud 70 and is normally held away from plate 16 by a spring 71. A latch assembly is provided to hold the gear assembly close to plate 16 as will be fully explained. The gears 66 have square openings therein adapted to engage the square ends of the rods. The central gear 65 and the gears 66 associated with the various rods are at all times in a meshed relation so that they all move simultaneously. A shaft 72 is provided secured to one of the gears 66 for rotating the gears of said assembly.

The latch assembly includes a punched out member 73 hinged to the plate 16, including projecting portions 74 which contact plate 67 for moving the gear assembly toward the plate 16. A knob 75 is positioned on the gear assembly for moving the member 73 toward plate 16. For holding the member 73 in actuated position, a latch 76 is provided. The latch 76 is pivoted on the end plate 16 at 77 and includes a portion 78 extending parallel to the shaft 24 and a bent-up portion 79 adjacent the end plate 15. This bent-up portion is contacted by the carriage 23 at the end of the reciprocal motion to cause the latch 76 to automatically disengage when the tuner is operated allowing the spring 71 to move the gear mechanism out of engagement with the rods. When the tuning mechanism is installed in a radio set the actuating knob 75 and the shaft 72 will extend through the housing to permit the tuning mechanism to be adjusted to the frequencies desired without opening the housing to the set proper.

In Figs. 6 and 7 the relative position of rods 17 and 18 is shown when rod 17 is shifted (moved to the right) and rod 18 is in the normal position. In Fig. 7 the gear assembly is in the normal position away from plate 16 and the gears are not in contact with any of the rods. In Fig. 6 the gear assembly has been moved toward the end plate 16 and the gear 66 engages the rod 17 with the square opening in the gear fitting over the square end of the rod. Accordingly, as the gears are rotated the rod 17 is rotated and the stop 20 is moved longitudinally thereon. Means such as stays 80 (Fig. 6) are provided to prevent rotation of the stops with the rods. A stay is not shown associated with rod 18 to simplify the disclosure but each rod is provided with a stay. Wire clips 81 are provided on the rods and stays to prevent unintentional rotation of the rods. It is, therefore, seen that when the gear assembly is engaged by movement of the member 75, rotation of the shaft 72 will be transmitted through the gears to the rod which is actuated resulting in movement of the stop along the rod. Accordingly, the stops can be set so that when the operating member is in engagement therewith the frequency selecting components of the radio receiver are positioned so that any frequency desired will be received. It is to be noted that when the stops are set by the pre-setting mechanism, the stops and rods are in the same position (actuated position) as they are any other time the operating member is in engagement with the stop to tune the receiver to the frequency defined by the particular stop. For this reason inaccuracy of parts is compensated for in the pre-setting operation and will not result in inaccuracy of tuning.

As is apparent in Figs. 5, 6 and 7, the rod 19 is not adapted to be operated by the gear mechanism but includes a separate actuating member 82. This arrangement is provided so that the stop 22 is at all times capable of movement along the rod 19 by rotation of the member 82. Thus when the operating member 26 is positioned against the stop 22, manual control of the frequency selective mechanism is possible. The threads on the rod 19 have a larger pitch than the threads on the other rods so that rotation of the rod will cause comparatively rapid movement of the stop, whereas movement of the rods 17 and 18 by the gears will cause realtively small longitudinal movement of the stops thereon for accurate pre-setting thereof. A flexible shaft may be provided for coupling to the actuating member 82 for remote control thereof, the member 82 having a recessed and splined portion on the end thereof to facilitate connection of such a shaft thereto.

In Fig. 2 the tuner is illustrated as including a switch 83 having a movable actuating member 84 projecting through the frame member 15. The movement of the carriage 23 to the left under the action of the solenoid causes the member 84 to be moved, closing the switch contacts. This switch 83 may be used to provide an additional control function such as muting the audio circuit of the receiver when the tuner operates.

It is, therefore, seen that a compact electromechanical tuning device is provided having means for moving the frequency selective components of a radio circuit to pre-set positions corresponding to predetermined frequencies. The mechanism permits any frequencies desired in the frequency band of the receiver to be preset and includes self-contained means for changing the pre-set frequencies. By utilizing fixed stops and an operating member adapted to be moved into engagement with the stops the moving parts have been reduced to a minimum and the mass of the moving parts made very small so that a small amount of power is required for operation of the device and the operation is relatively quiet. The pre-setting means provided are very simple in operation and result in accurate setting of the stops for precise tuning of the receiver to the frequencies selected.

Although the invention has been described with reference to the preferred embodiment thereof, it is obvious that various changes and modifications can be made therein without departing from the intent of the invention. The scope of the invention is defined in the appended claims.

I claim:

1. In radio tuning apparatus having frequency changing means and control means for adjusting said frequency changing means to predetermined tuning positions, frame means having a longitudinal axis, a plurality of stops on said frame means concentrically arranged about said axis and adjustable axially thereof, an operating member for changing the positions of said frequency changing means, and means for moving said operating member into abutting relation with said stops including electrical means for moving said member longitudinally along said axis in one direction and mechanical means for rotating said member into alignment with one of said stops and for moving said member in the direction opposite to said one direction into abutting relation with said one stop.

2. Automatic selecting mechanism comprising a frame means, a shaft of rectangular cross section having a twisted portion at one end thereof mounted for rotation on said frame means, a plurality of stops supported by said frame means equally spaced about said shaft, a carriage unit supported on said frame means for reciprocal movement along said shaft including an operating member supported for reciprocal movement with said carriage unit along said shaft and for rotary movement with said shaft to positions in abutment with said stops, means for moving said carriage unit longitudinally along said shaft away from one stop, means on said carriage unit cooperating with the twisted portion of said shaft for rotating said shaft and said operating member when said carriage unit traverses the twisted portion of said shaft, and means for moving said carriage along said shaft in the opposite direction until said operating member is in abutment with the next stop.

3. Automatic selecting mechanism comprising a frame means, a shaft of rectangular cross section having a twisted portion at one end thereof mounted for rotation on said frame means, a plurality of fixed stops supported by said frame means at equal distances from said shaft, a carriage supported on said frame for reciprocal movement along said shaft including an operating member supported for reciprocal movement with said carriage unit along said shaft and for rotary movement with said shaft to positions in abutment with said stops, means for moving said carriage unit longitudinally along said shaft away from one stop, means on said carriage unit cooperating with the twisted portion of said shaft for rotating said shaft and said operating member when said carriage unit traverses the twisted portion of said shaft, means for moving said carriage along said shaft in the opposite direction until said operating member is in abutment with the next stop, and means to prevent rotation of said shaft and operating member as said carriage traverses said twisted portion of said shaft in said opposite direction.

4. In control apparatus having movable control means, a device for moving said control means step by step to predetermined control positions, comprising a frame structure, a shaft having a twisted portion mounted for rotation on said frame structure, a carriage unit supported on said frame structure for movement along said shaft and supporting said movable control means and means for causing reciprocating movement of said carriage unit along said shaft, said carriage unit including ratchet means having a portion engaging said twisted portion of said shaft for rotating said shaft when said carriage moves along said shaft in one direction, said shaft being operatively connected to said control means for causing rotary movement of said control means as said carriage unit traverses said twisted portion of said shaft in one direction.

5. In control apparatus having movable control means, the combination of means for moving said control means step by step to predetermined control positions, comprising a frame structure, a shaft having a twisted portion mounted for rotation on said frame structure, and a carriage unit supporting said control means and mounted on said frame structure for reciprocal movement along said shaft, said carriage unit including ratchet means having a portion engaging said twisted portion of said shaft for causing step by step rotary movement of said shaft in response to reciprocation of said carriage unit on said shaft, said control means being operatively connected to said shaft and being rotated therewith.

6. Automatic selecting mechanism comprising frame means having a longitudinal axis, a plurality of stops supported by said frame means spaced about said longitudinal axis and adapted to be adjustably positioned along individual axes which are parallel to said longitudinal axis, an operating member supported on said frame means for movement longitudinally along said longitudinal axis and for step by step rotary movement about said longitudinal axis to positions in abutment with said stops, and actuating means adapted to move said operating member longitudinally along said longitudinal axis away from one stop, rotate said member one step at the end of said movement, and move said member in the opposite direction in abutting relation with one of said stops.

7. Automatic selecting mechanism comprising frame means having a longitudinal axis, a plurality of stops supported by said frame means equally spaced about said axis and adapted to be adjustably positioned parallel to said axis, an operating member supported on said frame means for movement longitudinally along said axis and for step by step rotary movement about said axis to positions in abutment with said stops, and means for moving said operating member including electrically operated means for moving said member longitudinally along said axis away from a stop and mechanical means for rotating said member one step each time said member reaches the end of said movement in said one direction and for moving said member in the direction opposite to said one direction in abutting relation with the next stop.

8. Automatic selecting mechanism comprising frame means having a longitudinal axis, a plurality of equally spaced rods positioned on said frame means parallel to and at a common distance from said axis, stops supported on said rods capable of being adjustably positioned along said rods, an operating member supported on said frame means for movement longitudinally along said axis and for step by step rotary movement about said axis to positions in abutment with said stops, and means for moving said operating member into said positions including a solenoid for moving said member longitudinally along said axis in one direction, mechanical means including a twisted shaft and ratchet assembly for rotating said member one step each time said member reaches the end of said movement in said one direction, and a spring for moving said member in the direction opposite to said one direction, whereby said member is positioned in abutting relation with one of said stops.

9. Automatic selecting means comprising frame means having two end plates, a shaft supported by said end plates for rotation thereon, said frame means including a plurality of threaded rods supported by said end plates concentrically about said shaft and having ends projecting through said end plates, said rods having square portions on the ends projecting through one of said end plates and rims on the ends projecting through the second end plate, springs positioned between said second end plate and the rims on said rods for holding said rods in a normal position, stops supported by said rods having threads engaging the threads on said rods for adjustably positioning said stops on said rods, an operating member supported on said frame means for movement relative thereto to positions in abutment with said stops, said operating member exerting sufficient pressure on the stop engaged to move the rod supporting said stop longitudinally to an actuated position with said square end projecting beyond said one end plate, a gear assembly secured to said one end plate including a plurality of gears having square openings therein positioned in line with said rods with the openings adapted for engagement with said square portions of said rods, said gear assembly having a first position in which said gears are out of engagement with said rods and a second position in which said gears are in such position that the gear in line with a rod which is in actuated position will engage the square portion thereof to cause said rod to be rotated by said gear assembly and the stop associated with said rod to be moved longitudinally along said rod.

10. In an automatic selecting mechanism having an operating member adapted to be moved into predetermined positions, frame means including a pair of end plates and a plurality of threaded rods having square end portions supported on said end plates for rotary movement and limited longitudinal motion relative thereto, stops adjustably positioned on said rods with threaded openings therein engaging the threads on said rods, said stops being adapted to be selectively engaged by said operating member for determining the position thereof, means for holding said rods in normal positions and for moving the rod supporting a stop which is engaged by said operating member longitudinally to an actuated position, a gear assembly including a plurality of gears having square openings therein positioned in line with said rods with said openings adapted for engagement with the square ends of said rods, said gear assembly having a first position in which said gears are out of engagement with said rods and a second position in which said gears are in such position that the gear in line with a rod which is in actuated position will engage the square portion thereof to cause said rod to be rotated by said gear assembly and the stop associated with said rod to be moved longitudinally along said rod, and means for automatically moving said gear assembly to said first position when said operating member is moved by said selecting mechanism.

11. In an automatic selecting mechanism having an operating member adapted to be moved into predetermined positions, frame means including a plurality of parallel rods, stops adjustably positioned on said rods adapted to be selectively engaged by said operating member for determining the position thereof, means including provisions on said stops and said rods to cause movement of said stops along said rods in response to rotation of said rods and pre-setting means including a plurality of gears adapted to individually engage said rods, said pre-setting means being secured to said frame means and having a first position in which said gears are out of engagement with said rods and a second position in which said gears are in such position that the rod supporting the stop engaged by said operating member is engaged by the corresponding gear for changing the position of said stop on said rod.

12. In an automatic selecting mechanism having an operating member adapted to be moved into predetermined positions, frame means including a pair of end plates and a plurality of threaded rods supported on said end plates for rotary movement and limited longitudinal movement relative thereto, stops adjustably positioned on said rods with threaded openings therein engaging the threads on said rods, said stops being adapted to be selectively engaged by said operating member for determining the position thereof, means for holding said rods in normal position and for moving the rod supporting the stop which is engaged by said operating member longitudinally to an actuated position, and pre-setting means including a plurality of gears positioned in line with said rods, said pre-setting means having a first position in which said gears are out of engagement with said rods and a second position in which said gears are in such position that the gear in line with the rod which is in actuated position will engage said rod, said gears and said rods having registering provisions thereon for transmitting movement of said gears to said rods when a gear is in engagement with a rod to cause the stop on the rod engaged to be moved thereon.

13. In radio tuning apparatus having frequency changing means and control means for adjusting the position of said frequency changing, the combination of means for moving said control means step by step to predetermined control positions comprising, frame means, a plurality of spaced stops supported on said frame means, an operating member coupled to said control means and supported for longitudinal movement on said frame means to positions in abutment with said stops, means for moving said operating member longitudinally along said frame means, and means for causing relative movement between said operating member and said stops in response to longitudinal movement of said member so that said member is moved step by step from one stop to the next, including a shaft of rectangular cross section having a twisted portion and a member cooperating with said shaft having a rectangular opening therein receiving said shaft so that movement of said member along said shaft causes relative rotation between said shaft and said member.

14. A tuner for radio apparatus having frequency selecting mechanism controlled by the position of mechanical tuning means, including in combination, frame means having longitudinally extending portions, a plurality of stops adjustably positioned along said portions, an operating member coupled to said tuning means, means mounting said operating member for longitudinal and rotary movement with respect to said frame to positions in abutting relation with said stops, and an actuating mechanism for said operating member including means for moving said operating member step by step from one stop to the next and a circuit for controlling said moving means, said circuit having fixed contacts and switches associated with each of said stops and a movable contact cooperating with said fixed contacts and mechanically connected to said operating member, said movable contact being constructed and arranged to engage all of said fixed contacts except the fixed contact associated with the particular stop with which the operating member is in abutment, said actuating mechanism being energized upon closing of said circuit by operation of one of said switches to cause movement of said operating member consecutively to said stops until the stop associated with the switch selected is reached when said movement is stopped due to the circuit being broken by disengagement of said movable contact from the fixed contact associated with said stop.

15. A tuner for radio apparatus having frequency changing means in which the frequency of the radio apparatus depends on the position of said means including in combination frame means having longitudinally extending portions, a plurality of stops supported on said frame means and adjustably positioned along said longitudinally extending portions, an operating member connected to said frequency changing means for changing the position thereof, means mounting said operating member for longitudinal and rotary movement with respect to said frame means, and an actuating mechanism including an electrically driven carriage and shaft assembly for moving said operating member step by step to positions in abutment with said stops, said actuating mechanism also including a circuit therefor having switches and fixed contacts associated with each of said stops and a movable contact cooperating with said fixed contacts and mechanically connected to said operating member, said movable contact being of such configuration and so positioned with respect to said operating member to engage all of said fixed contacts except the fixed contact associated with the particular stop with which the operating member is in abutment, said circuit energizing said electrically driven carriage and shaft assembly upon actuation of one of said switches for moving said operating member step by step to said stops until the stop associated with the switch selected has been reached when said movement is stopped due to the circuit being broken by disengagement of said movable contact with the fixed contact associated with said stop.

16. A tuner for radio apparatus having frequency changing means in which the frequency of the radio apparatus depends on the position of said frequency changing means including in combination a turret which remains stationary during the tuning operation, said turret including fixed frame means having a plurality of rods supported thereon and stops individually adjustably positioned on said rods, an operating member connected to said frequency changing means for changing the position thereof, and actuating means including means for moving said operating member step by step to positions in abutment with said stops and also including a circuit having switches and fixed contacts associated with each of said stops and a movable contact cooperating with said operating member to engage all of said fixed contacts except the fixed contact associated with the particular stop with which the operating member is in abutment, said circuit energizing said actuating means upon operation of one of said switches to effect movement of said operating member step-by-step to said stops until said one stop has been reached when said movement is stopped due to the circuit being broken by disengagement of said movable contact with the fixed contact associated with said one stop.

17. In radio tuning apparatus having frequency changing means and control means movable to a plurality of positions for adjusting said frequency changing means to predetermined tuning positions, the combination including, fixed frame means, a plurality of threaded rods supported on said frame means for rotation about axes which remain fixed at all times, stops adjustably supported on said rods, actuating means for moving said control means into positions in abutment with said stops for determining the position of said control means, said stops having threads thereon engaging the threads on said rods for movement longitudinally along said rods when said rods are rotated, and a manual actuating knob connected to one of said rods for rotating said one rod to change the position of the stop thereon.

18. Radio tuning apparatus including in combination, frame means including a pair of fixed spaced end plates and a plurality of threaded rods supported on said end plates for rotation about axes which remain fixed at all times, stops individually supported on said rods, frequency changing means, control means connected to said frequency changing means, actuating means for moving said control means into positions in engagement with said stops and thereby adjusting said frequency changing means to predetermined tuning positions, said stops having threads thereon engaging the threads on said rods for movement longitudinally along said rods when said rods are rotated, one of said rods extending through an opening in one of said end plates, a manual actuating knob directly connected to said one rod for rotating said one rod to change the position of the stop thereon, said actuating knob being mounted for rotation about the axis of said one rod and being fixed against other motion at all times, and a gear assembly including gears having fixed axes in alignment with the other ones of said rods to be selectively engaged by said other rods for rotating the same and changing the position of the stops thereon.

19. Automatic selecting means including in combination, frame means having two end plates, a shaft supported by said frame for rotation thereon, said frame means including a plurality of threaded rods supported by said end plates concentric about said shaft, at least one of said rods being supported for limited longitudinal movement with respect to said end plates, spring means holding said one rod in a normal position, stops supported by said rods having threads engaging the threads of said rods for positioning said stops on the rods, an operating member coupled to said shaft, means supporting said operating member on said frame means for longitudinal and rotary movement relative thereto into positions in abutment with said stops, said operating member exerting sufficient pressure on said stop supported by said one rod when said operating member engages the same to move said one rod longitudinally to an actuated position, gear means positioned adjacent said one rod, said one rod including a portion engaging said gear means when said one rod is in said actuated position so that movement of said gear means causes rotation of said one rod and movement of said stop along said one rod.

WILBUR C. JACKSON.

REFERENCES CITED

The following references are of record in the file of this patent:

UNITED STATES PATENTS

| Number | Name | Date |
|---|---|---|
| 1,157,761 | Clark | Oct. 26, 1915 |
| 1,239,055 | Sparks | Sept. 4, 1917 |
| 2,051,438 | Dwyer | Aug. 18, 1936 |
| 2,145,895 | Samuelson | Feb. 7, 1939 |
| 2,164,309 | Collins | July 4, 1939 |
| 2,192,706 | Good et al. | Mar. 5, 1940 |
| 2,235,216 | Koberich | Mar. 18, 1941 |
| 2,310,720 | Wandrey | Feb. 9, 1943 |
| 2,342,691 | Plensler | Feb. 29, 1944 |
| 2,342,851 | Fichter et al. | Feb. 29, 1944 |
| 2,389,213 | Swarz | Nov. 20, 1945 |
| 2,391,470 | May | Dec. 25, 1945 |
| 2,411,754 | Pifer et al. | Nov. 26, 1946 |